US005694367A

United States Patent [19]
Toyoshima et al.

[11] Patent Number: 5,694,367
[45] Date of Patent: Dec. 2, 1997

[54] SEMICONDUCTOR MEMORY OPERABLE WITH LOW POWER SUPPLY VOLTAGE

[75] Inventors: Hideo Toyoshima; Koichi Takeda; Shigeru Kuhara, all of Tokyo, Japan

[73] Assignee: NEC Corporation, Tokyo, Japan

[21] Appl. No.: 681,860

[22] Filed: Jul. 29, 1996

[30] Foreign Application Priority Data

Jul. 28, 1995 [JP] Japan .................................. 7-212653

[51] Int. Cl.[6] ............................................. G11C 7/02
[52] U.S. Cl. .......................... 365/207; 365/177; 365/208
[58] Field of Search ................................. 365/207, 208, 365/226, 230.03, 189.06, 177; 327/103, 52, 51

[56] References Cited

U.S. PATENT DOCUMENTS

| | | | |
|---|---|---|---|
| 5,331,233 | 7/1994 | Urakawa | 307/530 |
| 5,406,148 | 4/1995 | Yokomizo | 327/51 |
| 5,550,778 | 8/1996 | Takahashi | 365/207 |
| 5,555,215 | 9/1996 | Nakagome et al. | 365/226 |

OTHER PUBLICATIONS

"A 6ns ECL 100K I/O and 8–ns 3.3–V TTL I/O 4–Mb BiCMOS SRAM" IEEE Journal of Solid–State Circuits, vol.27, No.11, Nov. 1992, pp. 15–0–1510.

"A 220–MHz Pipelined 16–Mb BiCMOS SRAM with PLL Proportional Self-Timing Generator" IEEE Journal of Solid–State Circuits, vol. 29, No. 11, Nov. 1994, pp. 1317–1322.

Primary Examiner—David C. Nelms
Assistant Examiner—Hien Nguyen

[57] ABSTRACT

A semiconductor memory includes a plurality of first memory cell arrays, a pair of first common data lines which are provided for the plurality of first memory cell arrays, and a sensing section including a pair of first bipolar transistors whose emitters are respectively connected to the first common data lines and first constant current sources. Each first memory cell arrays includes a plurality of second memory cell arrays, a pair of second common data lines, a first differential amplifier including a second constant current source and a pair of second bipolar transistors whose bases are respectively connected to the second common data lines, whose bases are connected to the second constant current source together, and whose collectors are connected to the first common data lines, and a third constant current source of a second differential amplifier. Each second memory cell arrays includes a plurality of third memory cell arrays, a pair of third common data lines, a pair of third bipolar transistors whose bases are respectively connected to the third common data lines, whose emitters are connected to the third constant current source together to constitute the second differential amplifier, and whose collectors are respectively connected to the second common data lines, and a first control circuit for selectively activating the pair of third bipolar transistors. Each third memory cell arrays includes a pair of bit lines, a plurality of memory cells connected to the pair of bit lines, and a second control circuit for selectively connecting the pair of bit lines to the pair of second common data lines.

12 Claims, 6 Drawing Sheets

SEMICONDUCTOR MEMORY OPERABLE WITH LOW POWER SUPPLY VOLTAGE

BACKGROUND OF THE INVENTION

1. Field of the Invention

The present invention relates to a semiconductor memory, and more particularly, to a semiconductor memory which can operate with high speed under low power supply voltage.

2. Description of Related Art

Figure 1:
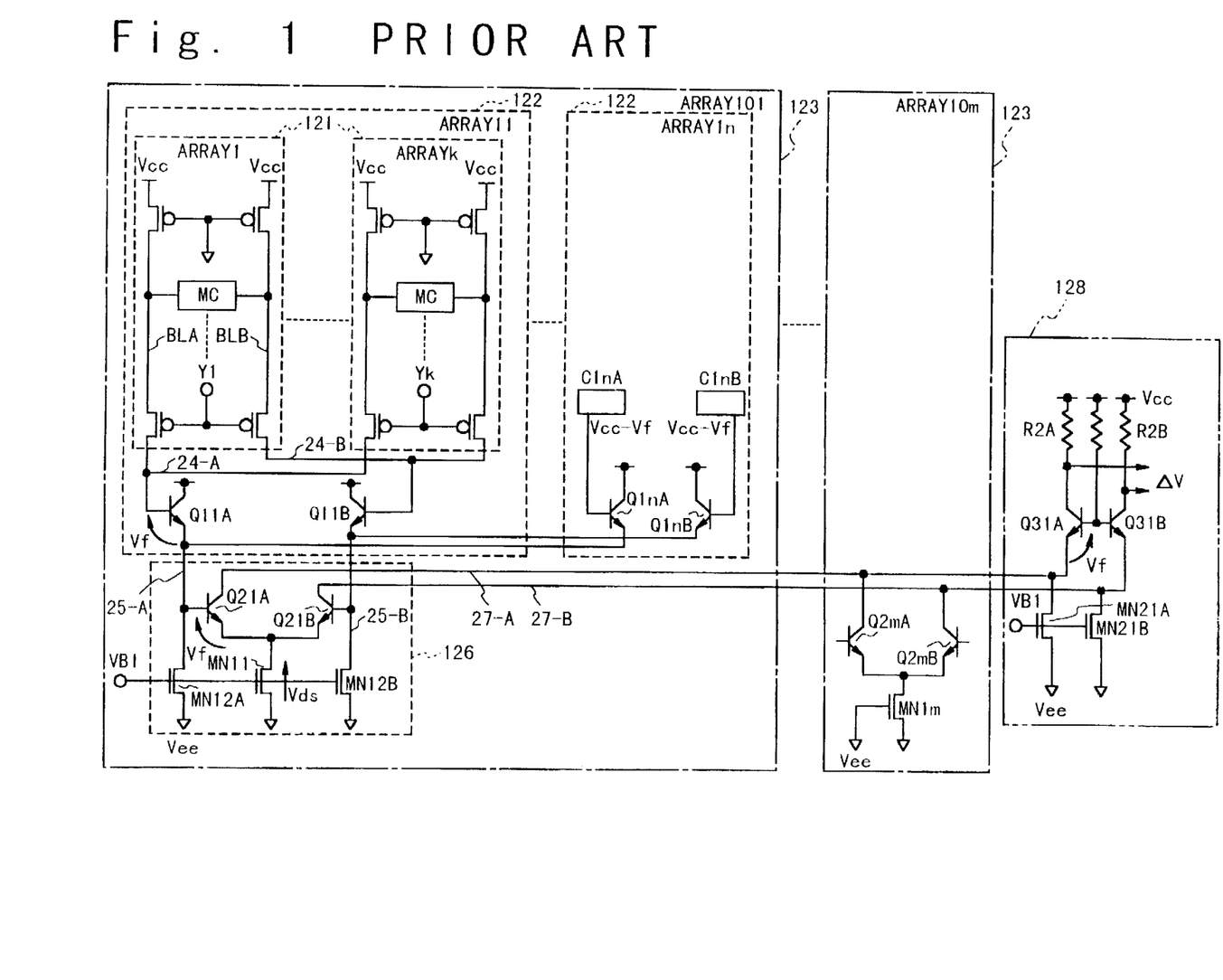
FIG. 1 is a block diagram illustrating the structure of a conventional BiCMOS SRAM.

There are well known various semiconductor memories. As one of them, there is a static random access memory (SRAM) such as a BiCMOS SRAM which can write and read a huge amount of data at high speed and in which metal-oxide-semiconductor field effect transistor (MOSFET) circuit and bipolar circuit consisting of bipolar transistors are integrated on a same substrate. FIG. 1 shows an example of read circuit of a conventional large scaled BiCMOS SRAM. The read circuit is described by Nakamura et al. in "A 6-ns ECL 100K I/O and 8-ns 3.3-V TTL I/O 4-Mb BiCMOS SRAM" (IEEE Journal of Solid-State Circuits, Vol. 27, No. 11, November 1992, pp. 1504–1510). Referring to FIG. 1, the BiCMOS SRAM is composed of more than one upper level memory cell arrays (ARRAY101 to ARRAY10m) 123. The upper level memory cell arrays 123 have the same structure and each of the memory cell arrays 123 is composed of more than one middle level memory cell arrays (ARRAY11 TO ARRAY1n) 122. The middle level memory cell arrays (ARRAY11 TO ARRAY1n) 122 have the same structure, and each of the memory cell arrays 122 is composed of more than one lower level memory cell arrays (ARRAY1 to ARRAYk) 121. The lower level memory cell arrays 121 have the same structure. Each of the middle level memory cell arrays 122 is provided with a differential bipolar transistor pair in common to all the lower level memory cell arrays 121. Each of the upper level memory cell arrays 123 is provided with a first sense amplifier 126 in common to all the middle level memory cell arrays 122. A second sense amplifier 128 is provided for all the memory cell arrays 123.

Each of the lower level memory cell arrays 121 includes a plurality of memory cells MCs arranged in a column or Y direction and a pair of bit lines BLA and BLB. The plurality of memory cells MCs are connected to the bit line pair.

Figure 2:
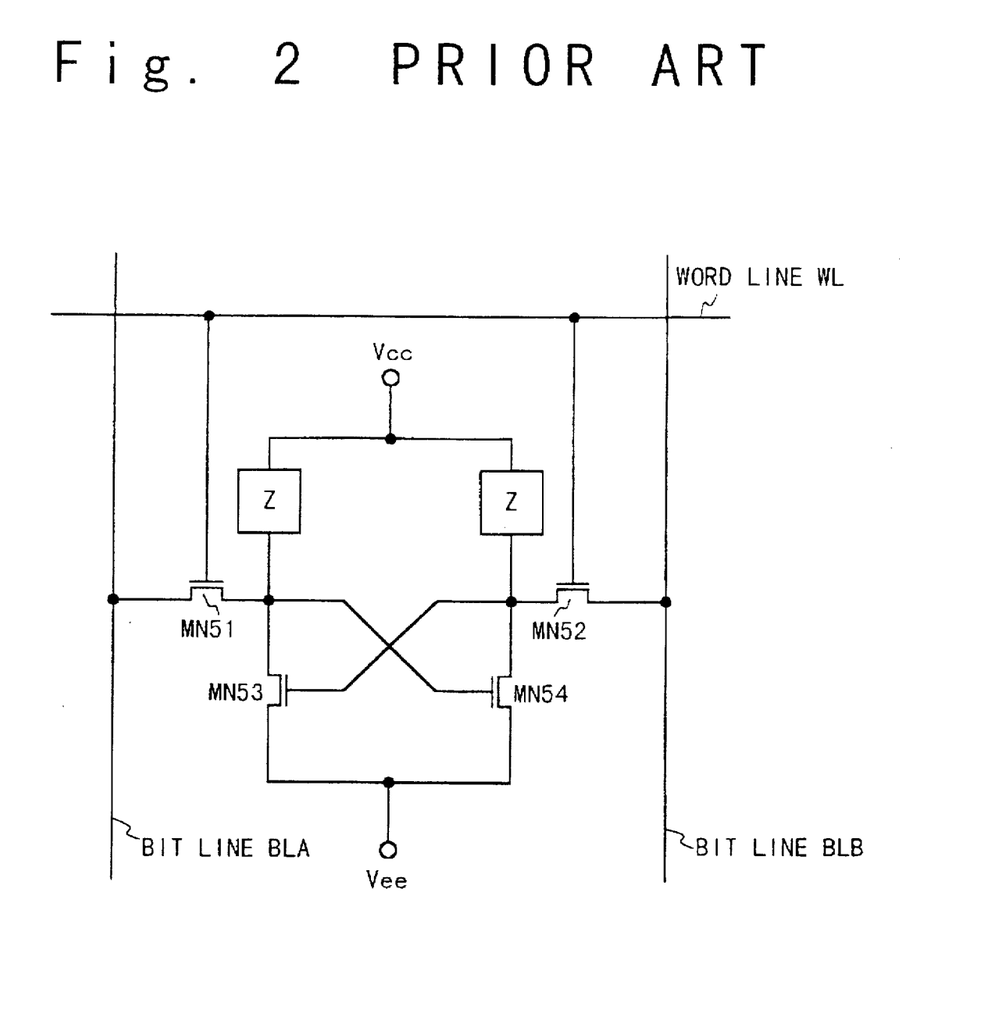
FIG. 2 is a circuit diagram illustrating the structure of a memory cell used in the conventional BiCMOS SRAM of FIG. 1.

Referring to FIG. 2, the memory cell includes a flip-flop composed of MN53 and MN54 and loads Z. The load Z is composed of a high impedance element or a MOS transistor whose gate is connected to the corresponding driving MOS transistor. The output terminals of the MOS transistors MN53 and MN54 are connected to a higher potential power supply line Vcc via the loads, respectively. Also, the output terminal of each of the MOS transistors MN53 and MN54 is connected to the gate of the other MOS transistor. That is, the MOS transistors MN53 and MN54 are cross-connected. The MOS transistors MN53 and MN54 are also connected to a low potential power supply line Vee. The memory cell is connected to the bit lines BLA and BLB via MOS transistors MN51 and MN52 whose gates are connected to a word line extending in a row or X direction. The word line is provided for each memory cell MC.

Referring to FIG. 1 again, ends of the bit lines BLA and BLB of the pair are connected to the higher potential power supply line Vcc through the load MOS transistors. Also, the bit lines BLA and BLB of each of the lower level memory cell arrays 121 (ARRAY1 to ARRAYk) are connected to common data lines 24-A and 24-B for the lower level memory cell arrays 121 via MOS transistors as Y-selection transistors, respectively. The gates of the Y-selection MOS transistors in the memory cell array 121 is supplied with a Y selection signal. The common data lines 24-A and 24-B are also connected to clamp circuits C11A and C11B. The common data lines 24-A and 24-B are connected to the bases of NPN bipolar transistors Q11A and Q11B of a differential pair, respectively. The collectors of the bipolar transistors Q11A and Q11B are connected to the higher potential power supply line Vcc. The emitters of the bipolar transistors Q11A and Q11B are connected in the emitter follower form to common data lines 25-A and 25-B, respectively. The common data lines 25-A and 25-B are provided in common to all the middle level memory cell arrays ARRAY11 to ARRAY1n.

The common data lines 25-A and 25-B are connected to a first sense amplifier 126. The first sense amplifier 126 is composed of a pair of NPN bipolar transistors Q21A and Q21B and MOS transistors MN11, MN12A and MN12B. The common data lines 25-A and 25-B are connected to the bases of the bipolar transistors Q21A and Q21B and to the lower potential power supply line Vee via the MOS transistors MN12A and MN12B, respectively. The emitters of the bipolar transistors Q21A and Q21B are commonly connected to the lower potential power supply line Vee via the MOS transistor MN11. The MOS transistors MN11, MN12A and MN12B function as constant current sources and the bipolar transistors Q21A and Q21B and the MOS transistor MN11 constitute as a differential amplifier. The gates of the MOS transistors MN11, MN12A and MN12B are connected to a predetermined bias power supply voltage VB1. The collectors of the bipolar transistors Q21A and Q21B are connected to common data lines 27-A and 27-B, respectively. The common data lines 27-A and 27-B are connected to other first sense amplifiers provided for the memory cell arrays ARRAY101 to ARRAY10m.

The complementary common data lines 27-A and 27-B are connected to the current sense section of the second sense amplifier 128. That is, the common data lines 27-A and 27-B are connected to the emitters of bipolar transistors Q31A and Q31B, respectively. The emitters are also connected to the lower potential power supply line Vee via MOS transistors MN21A and MN21B, respectively. The gates of the MOS transistors MN21A and MN21B are connected to the bias power supply VB1. The bases of the bipolar transistors Q31A and Q31B are connected in common to the higher potential power supply line Vcc via a resistor. The collectors of the bipolar transistors Q31A and Q31B are connected to the higher potential power supply line Vcc via resistors R2A and R2B, respectively. The 2-stage sense amplifier shown in FIG. 1 is called "the cascaded connection-type sense amplifier". The sense amplifier provides fast response characteristic when the common data line pair 27 is long and the wiring capacity is large.

In a read operation, it is assumed that the array 101 is selected from among the memory cell arrays ARRAY101 to ARRAY10m, for example. For this purpose, the gate of the current source MOS transistor MN11 which is provided in the first sense amplifier 26 of the memory cell array ARRAY101 is connected to the predetermined bias power supply VB1 so that the MOS transistor MN11 is activated, i.e., is set to the conductive state. Also, the gates of the MOS transistors in the first sense amplifiers of the upper level memory cell arrays ARRAY102 to ARRAY10m 123 except for the memory cell array ARRAY101 are connected to the low potential power supply Vee so that the MOS transistors MN1m are deactivated, i.e., set to the non-conductive state.

3

Through the above operation, the memory cell array ARRAY101 is selected from among the memory cell arrays ARRAY101 to ARRAY10m.

Next, it is assumed that the memory cell array ARRAY11 is selected from among the memory cell arrays ARRAY11 to ARRAY1n. For this purpose, the bases of each of the bipolar transistor pair in the memory cell arrays ARRAY12 to ARRAY1n are clamped to a voltage (Vcc-Vf) by the clamp circuits C12A and C12B, . . . , C1nA and C1nB, where Vf is the forward direction voltage between the base and the emitter in the bipolar transistor and typically takes about 0.8 V. Also, it is assumed that the memory cell array ARRAY1 is selected from among the memory cell arrays ARRAY1 to ARRAYk. For this purpose, the Y selection MOS transistors are used.

One of the word lines for the memory cells in the memory cell array ARRAY1 is activated. As a result, one of the memory cells MCs is selected in the memory cell array ARRAY1. A data is read out from the selected memory cell and outputted to the bit lines BLA and BLB via the MOS transistors MN51 and MN52 as a differential signal. At this time, one of the Y selection signals Y1 to Yk in the memory cell array ARRAY11 122, the Y selection signal Y1 in this example, is made active for the memory cell array ARRAY1. Thus, the differential signal on the bit line pair is transferred to the common data lines 24-A and 24B and supplied to the bases of the bipolar transistors Q11A and Q11B of the differential pair. In this case, since the bases of the bipolar transistors of the differential pairs in the non-selected memory cell arrays ARRAY12 to ARRAY1n, are connected to the voltage (Vcc-Vf) by the clamp circuits, the differential bipolar transistor pairs in the memory cell arrays ARRAY12 to ARRAY1n do not operate. As a result, only the differential signal from the memory cell array ARRAY1 is transferred to the common data lines 25-A and 25-B. FIG. 1 schematically shows the state in which the memory cell array ARRAY1 is selected.

The differential signal on the common data line pair 25 is supplied to the first sense amplifier 126. In the memory cell array ARRAY101, the gates of the MOS transistors MN11, MN12A and MN12B in the first sense amplifier 126 are connected to the bias power supply VB1. On the other hand, in the other memory cell array ARRAY102 to ARRAY10m, the gates of the MOS transistors corresponding to the MOS transistor MN11 in the first sense amplifier of the memory cell array ARRAY101 are connected to the lower potential power supply voltage Vee, as shown in FIG. 1. The differential signal from the memory cell array ARRAY1 is amplified by the first sense amplifier 126. The amplified differential signal is output in a current form to the common data lines 27-A and 27-B which are connected to the current sense section of the second sense amplifier 128.

In the current sense section of the second sense amplifier 128, the differential current signal is amplified and converted into voltages by the resistors R2A and R2B. Finally, the voltage difference ΔV between the bipolar transistors Q31A and Q31B is outputted from the second sense amplifier 128.

The structure of the sense amplifier which uses the bipolar transistors utilizes the characteristics of large mutual conductance, current cut-off frequency, small offset or the like of the bipolar transistor, and has the excellent characteristic in the highest operation speed for the large-scaled SRAM. It is one of the main reasons why BiCMOS SRAM is superior to CMOS SRAM in the operation speed that there is the sense amplifier using the high speed bipolar transistors in the read circuit of the BiCMOS SRAM.

4

As a power supply voltage is reduced in an LSI SRAM in recent years, reduction of the power supply voltage becomes an essential problem even in the SRAM and especially the high speed operation with about 1 V is required. However, in the read circuit using the conventional sense amplifier of a bipolar transistor type, the lower limit of the power supply voltage at which the read circuit can operate is determined to be about 2 V based on the structure of the sense amplifier itself. For this reason, there is a problem that the further reducing of power supply voltage is blocked.

The factor which determines the lower limit of the power supply voltage Vcc will be described below in detail with reference to FIG. 1. Referring to FIG. 1, the lower limit Vccmin of the power supply voltage is given as the sum of the base-emitter forward direction voltage Vf of the bipolar transistors Q11A and Q11B having the emitter follower structure, the base-emitter forward direction voltage Vf of the bipolar transistors Q21A and Q21B of the differential pair in the first sense amplifier 126 and the source-drain voltage Vds of the MOS transistor MN11 as the current source for the differential bipolar transistor pair. That is, the following equation (1) stands up.

$$Vccmin = 2Vf + Vds \quad (1)$$

In the above equation (1), if the base-emitter forward direction voltage Vf is 0.8 V and the source-drain voltage Vds is 0.2 V, the lower limit Vccmin of the power supply voltage becomes about 1.8 V. The most important matter is that the lower limit of the power supply voltage is determined because of the most basic circuit structure of the read circuit using the bipolar transistors in which circuit structure the emitter follower output is supplied to the bases of the bipolar transistors of the differential pair, as shown in FIG. 1.

SUMMARY OF THE INVENTION

Therefore, the present invention is made in view of such problems and an object of the present invention is to provide a semiconductor memory and a read circuit for the same which include bipolar transistor sense amplifiers and can operate at high speed under low power supply voltage.

In order to achieve an aspect of the present invention, a semiconductor memory includes a first memory cell array. The first memory cell array includes a plurality of second memory cell arrays, a pair of first common data lines, a first differential amplifier including a first constant current source and a pair of first bipolar transistors whose bases are respectively connected to the first common data lines and whose bases are connected to the first constant current source together, and a second constant current source of a second differential amplifier. Each of plurality of second memory cell arrays includes a plurality of third memory cell arrays, a pair of second common data lines, a pair of second bipolar transistors whose bases are respectively connected to the second common data lines, whose emitters are connected to the second constant current source together to constitute the second differential amplifier, and whose collectors are respectively connected to the first common data lines, and a first control circuit for selectively activating the pair of second bipolar transistors. Each of the plurality of third memory cell arrays includes a pair of bit lines, a plurality of memory cells connected to the pair of bit lines, and a second control circuit for selectively connecting the pair of bit lines to the pair of second common data lines.

The semiconductor memory may further includes a sensing section including a pair of third bipolar transistors whose emitters are respectively connected to the third common data lines and third constant current sources, a fourth differential amplifier for amplifying collector voltages of the third bipolar transistors, and an output circuit including two output bipolar transistor of an emitter follower structure, for outputting data corresponding to data stored in a selected one of the memory cells from the emitters of the output bipolar transistors.

Each of the first and second constant current sources includes a MOS transistor whose gate is connected to a predetermined voltage. The first differential amplifier includes first and second resistors which are respectively connected to collectors of the first bipolar transistors, and a third resistor which is connected to the first and second resistors at a connection node and a higher potential power supply line. The third resistor has a greater resistance than those of the first and second resistors.

The semiconductor memory may further includes a bias power supply for supplying the predetermined voltage to the gates of the MOS transistors of the first and second constant current sources. The bias power supply preferably includes a reference voltage generating section for generating a reference voltage, a fifth differential amplifier which is a replica of the first differential amplifier, for generating a voltage corresponding to a voltage at the connection node between the first and second resistors and the third resistor in the first differential amplifier, and an operation amplifier circuit for generating the predetermined voltage such that the voltage at the connection node is equal to the reference voltage.

In order to achieve another aspect of the present invention, a method of reading data in a semiconductor memory comprising the steps of:

selecting a row of memory cells for each of groups of memory cells having a matrix structure such that data of each of the memory cells of the selected row is read out on a bit line pair as a differential signal;

selecting one bit line pair for each of the groups of memory cells to connect the differential signal on the selected bit line pair to a first bipolar transistor pair of a first differential amplifier, wherein the first differential amplifier includes a first constant current source in addition to the first bipolar transistor pair, the first bipolar transistor pair is provided for each of the groups and the first constant current source is commonly provided for all the groups;

selectively activating one of the first bipolar transistor pairs for the groups; and amplifying the differential output of the activated first bipolar transistor pairs by a second differential amplifier.

In order to achieve a still another aspect of the present invention, the semiconductor memory may further includes plural first memory cell arrays, a pair of third common data lines which are respectively connected to collectors of the first bipolar transistors, a sensing section including a pair of third bipolar transistors whose emitters are respectively connected to the third common data lines and third constant current sources, and a third control circuit for selectively activating the pair of first bipolar transistors.

DESCRIPTION OF THE PREFERRED EMBODIMENTS

The present invention will be described below in detail with reference to the accompanying drawings.

Figure 3:
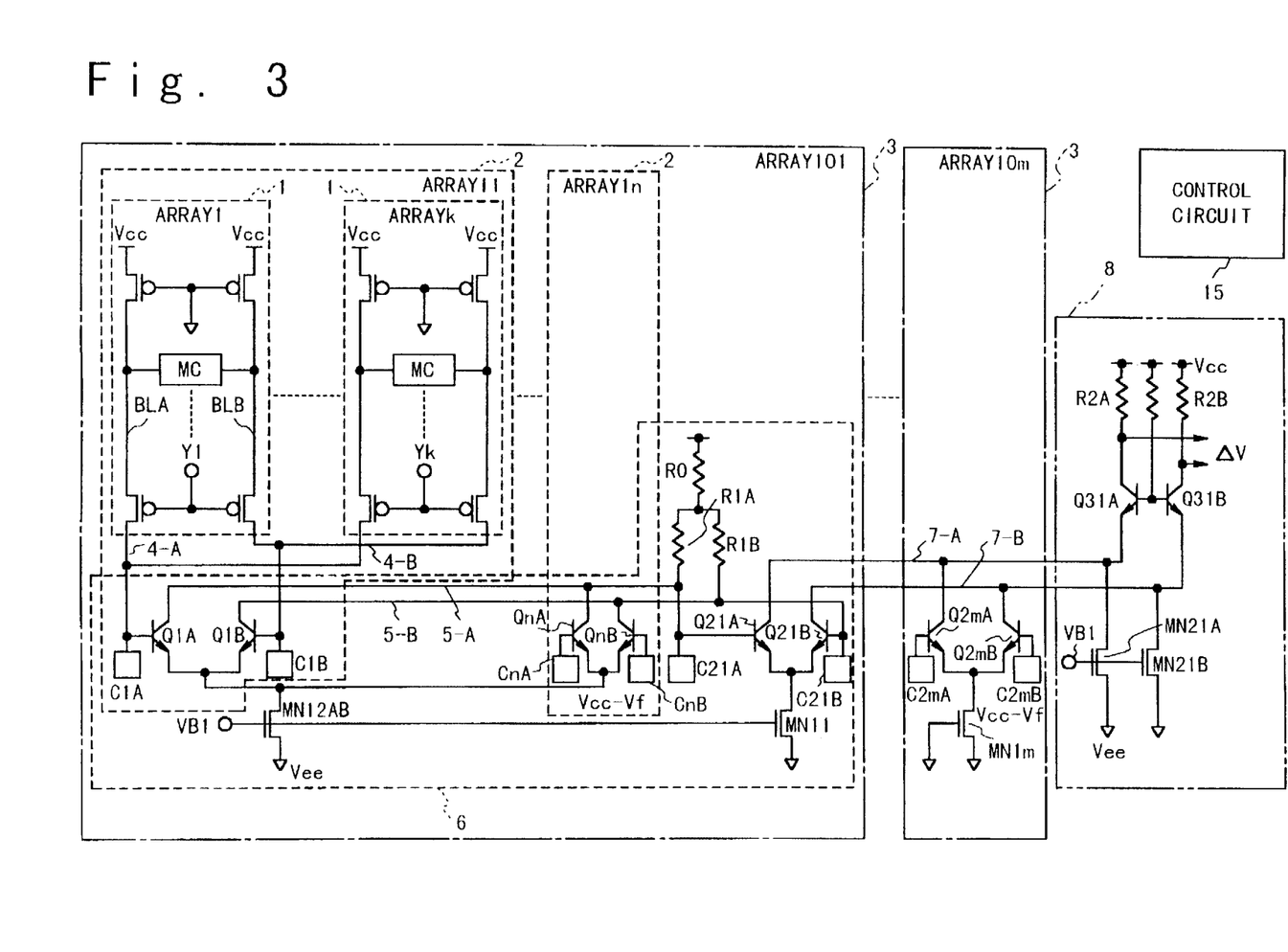
FIG. 3 is a block diagram illustrating the structure of a BiCMOS SRAM according to a first embodiment of the present invention.

FIG. 3 is a circuit diagram illustrating a BiCMOS SRAM according to the first embodiment of the present invention. Referring to FIG. 3, the BiCMOS SRAM is composed of more than one upper level memory cell arrays (ARRAY101 to ARRAY10m) 3. The upper level memory cell arrays 3 have the same structure and each of the memory cell arrays 3 is composed of more than one middle level memory cell arrays (ARRAY11 TO ARRAY1n) 2. The middle level memory cell arrays (ARRAY11 TO ARRAY1n) 2 have the same structure, and each of the memory cell arrays 2 is composed of more than one lower level memory cell arrays (ARRAY1 to ARRAYk) 1. The lower level memory cell arrays 1 have the same structure. Each of the middle level memory cell arrays 2 is provided with a differential pair of bipolar transistors Q1A and Q1B. Each of the upper level memory cell arrays 3 is provided with one first sense amplifier 6 in common to all the middle level memory cell arrays 2. The first sense amplifier 6 includes the differential pair of bipolar transistors Q1A and Q1B of each of the middle level memory cell arrays 2 and a MOS transistor MN12AB common to the all the middle level memory cell arrays 2. A second sense amplifier 8 is provided for all the memory cell arrays 3.

Each of the lower level memory cell arrays 1 includes a plurality of memory cells MCs arranged in a column or Y direction and a pair of bit lines BLA and BLB. The plurality of memory cells MCs are connected to the bit line pair. Each of memory cells is constructed in the same manner as in the conventional memory cell shown in FIG. 2.

Referring to FIG. 1 again, one ends of the bit lines BLA and BLB of the pair are connected to the higher potential power supply line Vcc through the load MOS transistors, respectively. Also, the bit lines BLA and BLB of each of the lower level memory cell arrays 1 (ARRAY1 to ARRAYk) are connected to common data lines 4-A and 4-B to the lower level memory cell arrays 1 via MOS transistors as Y-selection transistors, respectively. The gates of the Y-selection MOS transistors in the memory cell array 1 is supplied with a Y selection signal. The common data lines 4-A and 4-B are also connected to clamp circuits C1A and C1B which are controlled by a control circuit 15. The common data lines 4-A and 4-B are connected to the bases of NPN bipolar transistors Q1A and Q1B of the differential pair, respectively. The emitters of the bipolar transistors Q1A and Q1B are connected together. A MOS transistor MN12AB is provided between the emitters of the bipolar transistors Q1A, Q1B, . . . , QnA and QnB of all the middle level memory cell arrays 2 and the lower potential power supply Vee. The gate of the MOS transistor MN12AB is connected to a bias power supply VB1. The MOS transistor MN12AB functions as a constant current source. The collectors of the bipolar transistors Q1A and Q1B are connected to common data lines 5-A and 5-B, respectively.

The common data lines 5-A and 5-B are connected to the bases of bipolar transistors Q21A and Q21B of a differential pair of the first sense amplifier 6. The first sense amplifier 6 is composed of a pair of NPN bipolar transistors Q21A and Q21B and a MOS transistor MN11. The common data lines 5-A and 5-B are also connected to resistors R1A and R1B which are connected to the higher potential power supply Vcc via a resistor R0. The common data lines 5-A and 5-B are also respectively connected to clamp circuits C21A and C21B which are controlled by the control circuit 15. The emitters of the bipolar transistors Q21A and Q21B are commonly connected to the lower potential power supply line Vee via the MOS transistor MN11. The MOS transistor MN11 functions as a constant current source and the bipolar transistors Q21A and Q21B and the MOS transistor MN11 constitute as a differential amplifier. The gates of the MOS transistor MN11 is connected to the predetermined bias power supply voltage VB1. The collectors of the bipolar transistors Q21A and Q21B are connected to common data lines 7-A and 7-B, respectively.

The common data lines 7-A and 7-B are connected to other first sense amplifiers provided for the memory cell arrays ARRAY102 to ARRAY10m. The complementary common data lines 7-A and 7-B are connected to the current sense section of the second sense amplifier 8. That is, the common data lines 7-A and 7-B are connected to the emitters of bipolar transistors Q31A and Q31B, respectively. The emitters of the bipolar transistors Q31A and Q31B are also connected to the lower potential power supply Vee via MOS transistors MN21A and MN21B, respectively. The gates of the MOS transistors MN21A and MN21B are connected to the bias power supply voltage VB1. The bases of the bipolar transistors Q31A and Q31B are connected in common to the higher potential power supply line Vcc via a resistor. The collectors of the bipolar transistors Q31A and Q31B are connected to the higher potential power supply line Vcc via resistors R2A and R2B, respectively. The 2-stage sense amplifier shown in FIG. 3 is called "the cascaded connection-type sense amplifier".

In a read operation, it is assumed that the array ARRAY101 is selected from among the memory cell arrays ARRAY101 to ARRAY10m, for example. For this purpose, the gate of the current source MOS transistor MN11 which is provided in the first sense amplifier 6 of the memory cell array ARRAY101 is connected to the predetermined bias power supply voltage VB1 so that the MOS transistor MN11 is activated, i.e., is set to the conductive state. Also, the gates of the MOS transistors MN12 to MN1m in the first sense amplifiers of the memory cell arrays 3 except for the memory cell array ARRAY101 are connected to the low potential power supply Vee by the clamp circuit so that the MOS transistors MN1m is deactivated, i.e., set to the non-conductive state. Through the above operation, the memory cell array ARRAY101 is selected from among the memory cell arrays ARRAY101 to ARRAY10m.

Next, it is assumed that the memory cell array ARRAY11 is selected from among the memory cell arrays ARRAY11 to ARRAY1n, for example. For this purpose, the bases of the bipolar transistor pair in each memory cell array 2 are biased to a voltage (Vcc–Vf) by the clamp circuits C2A and C2B, ..., CnA and CnB, where Vf is the forward direction voltage between the base and the emitter in the bipolar transistor and typically takes about 0.8 V. One of the word lines for the memory cells in the memory cell array ARRAY1 is activated. As a result, one row of memory cells of the memory cells MCs is selected in the memory cell array ARRAY11 2. A data are read out from the selected row of memory cells and outputted to the bit lines BLA and BLB via the MOS transistors MN51 and MN52 as a differential signal in each memory cell. At this time, one of the Y selection signals Y1 to Yk in the memory cell array ARRAY11, e.g., the Y selection signal Y1 is made active for the memory cell array ARRAY1. Thus, only the differential signal on the bit line pair of the memory cell array ARRAY1 is transferred to the common data lines 4-A and 4-B and supplied to the bases of the bipolar transistors Q1A and Q1B of the differential pair. In this case, in the non-selected memory cell arrays ARRAY12 to ARRAY1n, because the bases of the bipolar transistors of the differential pairs are connected to the voltage (Vcc–Vf) by the clamp circuits, only the differential signal from the memory cell array ARRAY1 is transferred to the common data lines 5-A and 5-B. FIG. 3 schematically shows the state in which the memory cell array ARRAY11 is selected.

The differential signal on the common data line pair 5 is supplied to the bases of the bipolar transistors Q21A and Q21B of the differential amplifier of the first sense amplifier 6. In the memory cell array ARRAY101, the gate of the MOS transistor MN11 in the first sense amplifier 6 is connected to the bias power supply VB1. On the other hand, in the other memory cell arrays ARRAY102 to ARRAY10m, the gates of the MOS transistors MN12 to MN1m corresponding to the MOS transistor MN11 in the first sense amplifier of the memory cell array ARRAY101 is connected to the lower potential power supply voltage Vee as shown in FIG. 3. The differential signal from the memory cell array ARRAY1 is amplified by the first sense amplifier 6. Therefore, the amplified differential signal is output to the common data lines 7-A and 7-B which are connected to the current sense section of the second sense amplifier 8.

In the current sense section of the second sense amplifier 8, the differential current signal is amplified and converted into voltages by the resistors R2A and R2B. Finally, the voltage difference ΔV between the outputs of the bipolar transistors Q31A and Q31B is outputted from the second sense amplifier 8.

Figure 4:
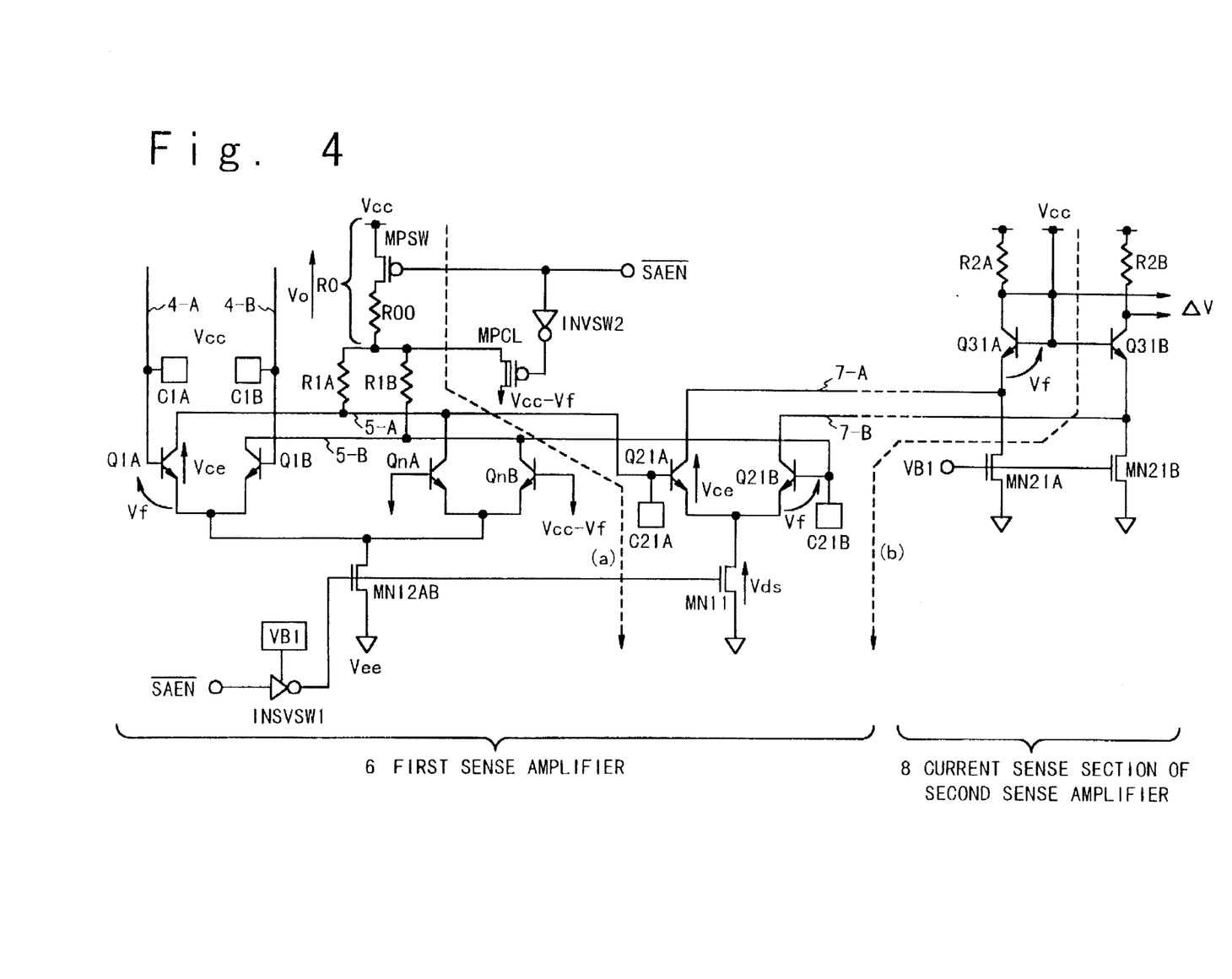
FIG. 4 is a circuit diagram illustrating the detail of the read circuit in the BiCMOS SRAM shown in FIG. 3.

FIG. 4 is a circuit diagram illustrating the detail of read circuit of the BiCMOS SRAM. In FIG. 4, only the first sense amplifier 6, common data line pair 7 (7-A and 7-B) and current sense section of the second sense amplifier 8 of FIG. 3 are partially shown. Referring to FIG. 4, the resistor R0 of FIG. 3 is actually composed of a resistor R00 and a MOS transistor MPSW. Further, one of the signal terminals of a MOS transistor MPCL is connected to a connection node between the resistor R00 and the resistors R1A and R1B and the other signal terminal of the MOS transistor MPCL is set to the voltage (Vcc–Vf). Also, the gate of the MOS transistor MPCL is connected to an activation signal line SAEN(*) ("*" means an inverted signal) for controlling the MOS transistors MPSW. A MOS inverter INVSW2 is connected to the activation signal line SAEN(*) and the gate of the MOS transistor MPCL. Moreover, the constant current source MOS transistor MN12AB is connected in common to the emitters of the differential bipolar transistor pairs Q1A and Q1B, ..., and QnA and QnB and a MOS inverter INVSW1 for driving the gates of the constant current source MOS transistors MN11 for the differential bipolar transistor pair Q21A and Q21B and the MOS transistor MN12AB.

The operation of the read circuit according to the first embodiment of the present invention will be described with reference to FIGS. 3 and 4. When the differential signal outputted from, for example, the memory cell array ARRAY101 from among the memory cell arrays ARRAY101 to ARRAY10m of FIG. 3 is to be selected, the gates of the current source MOS transistors MN11 and MN12AB of the first sense amplifier 6 for the memory cell array ARRAY101 are connected to the bias power supply voltage VB1. This is accomplished by inputting the power supply voltage Vee to the activation signal line SAEN(*) in FIG. 4. In this case, it is assumed that the node with the high potential is connected to the power supply VB1 in the inverter INVSW1 in FIG. 4. As a result, the resistor R0 (which is composed of the resistor R00 and the MOS transistor MPSW) is connected to the high potential power supply line Vcc, so that the first sense amplifier 6 of the array 101 is activated. On the other hand, at the same time, the high potential power supply Vcc is supplied to the signal line SAEN(*) of each of the memory cell arrays ARRAY102 to ARRAY10m except for the memory cell array ARRAY101, so that the gates of the constant current source MOS transistors of the first sense amplifier 6 in each of the memory cell arrays except the memory cell array ARRAY101 are connected to the low potential power supply Vee. Further, the common data lines 5-A and 5-B in each of the memory cell arrays ARRAY102 to ARRAY10m except for the memory cell array ARRAY101 are clamped to the potential (Vcc-Vf) by the clamp circuits C22A and C22B, . . . , C2mA and C2mB. Therefore, the bases of the differential bipolar transistor pairs Q22A and Q22B, . . . , and Q2mA and Q2mB are also clamped to the potential (Vcc-Vf) in the same manner in the first sense amplifiers 6 of the memory cell arrays ARRAY102 to ARRAY10m. Through the above operation, the memory cell arrays except for the memory cell array ARRAY101 are deactivated and only the memory cell array ARRAY101 is selected. With the above-mentioned structure, one of the (k×n×m) lower level memory cell arrays can be selected in the Y direction in accordance to the Y selection signal or address selection signal.

Next, the operation characteristic of the read circuit under the low power supply voltage in the first embodiment of the present invention will be described. The value of the resistor R0 which is composed of the series resistor of the resistor R00 and the MOS transistor MPSW is set in such a manner that the voltage drop in the resistor R0 is about 0.3 V which is determined by the product of the resistor value and the constant current defined by the MOS transistor MN12AB. On the other hand, if the differential read signal amplitude value which is generated by the resistors R1A and R1B is about 50 mV, it is enough for the circuit structure of this embodiment to amplify the signal. Therefore, there is no problem in that the operation of the read circuit is considered to neglect the voltage drops at the resistors R1A and R1B because these voltage drops are small compared to the voltage drop V0 at the resistor R0. In the present embodiment, the voltage drop V0 at the resistor R0 functions as a bias value between the collector and emitter of each of the bipolar transistors Q21A and Q21B of the differential pair which constitutes the cascaded connection, i.e., (collector-emitter voltage: Vce=V0).

In the embodiment, paths shown by broken lines (a) and (b) are a critical factor of the lower limit of the power supply voltage on the higher potential side in FIG. 4 and the lower limit of the power supply voltage is given by the following equation (2).

$$Vccmin = V0 + Vf + Vds \text{ path}(a) = Vf + Vce + Vds \text{ path}(b) \qquad (2)$$

If Vf=0.8 V, Vds=0.2 V, V0=Vce=0.30 V, the lower limit of the power supply voltage Vccmin becomes 1.3 V in calculation and the reduction of the power supply voltage can be accomplished lower by 0.5 V than the theoretical lower limit Vccmin of the power supply voltage in the above-mentioned conventional BiCMOS SRAM.

Figure 5:
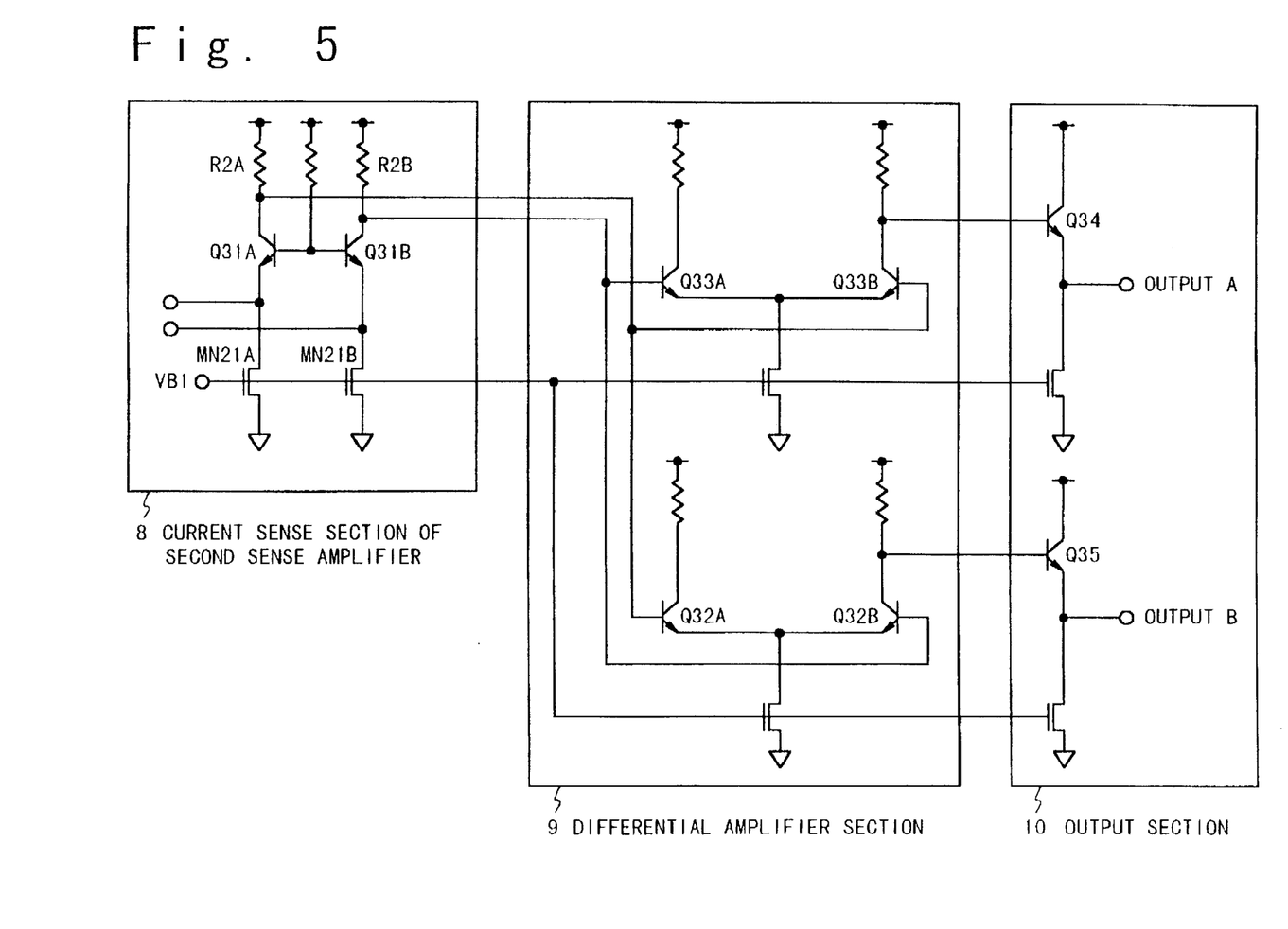
FIG. 5 is a circuit diagram illustrating the detail of the read circuit in the BiCMOS SRAM according to a second embodiment of the present invention.

Next, the read circuit according to the second embodiment of the present invention will be described with reference to FIG. 5. Referring to FIG. 5, the read circuit includes a differential amplifier section 9 and output section 10 following the current sense section of the second sense amplifier 8 which has the same as the structure as that shown in FIG. 3. In the second sense amplifier 8, the differential read current signal is current-sensed by the bipolar transistors Q31A and Q31B which are cascaded connected to the bipolar transistors Q21A and Q21B, and converted into voltage amplitudes by the resistors R2A and R2B. The voltage amplitude difference is amplified by the differential amplifier section 9 to about 0.5 V and complementary outputs A and B are provided from the output section 10 having an emitter follower structure. The gates of all the MOS transistors each of which constitutes the constant current sources in the current sense section of the second sense amplifier 8, differential amplifier section 9, output section 10 are connected to the predetermined constant power supply voltage VB1 to determine the current value.

Figure 6:
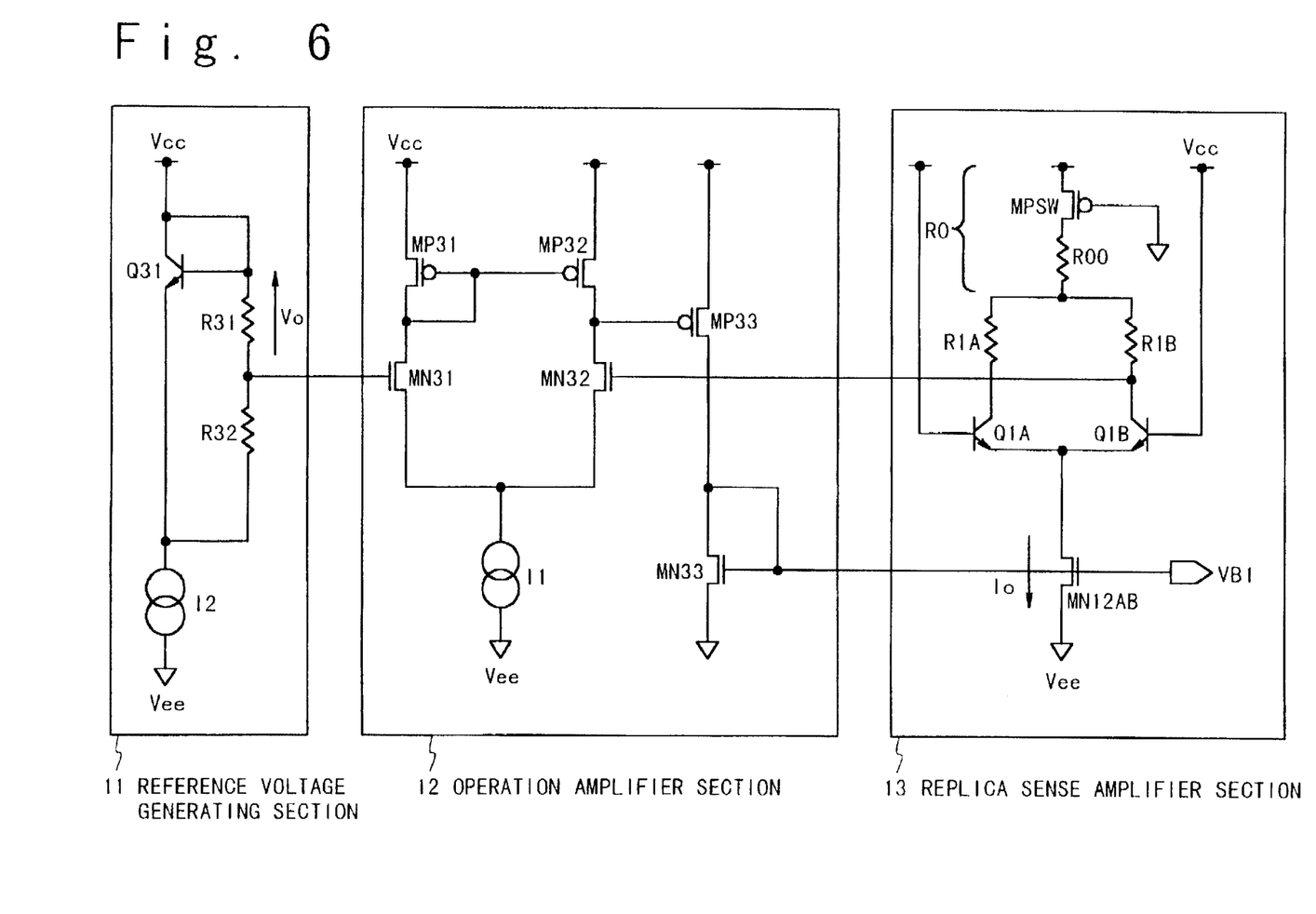
FIG. 6 is a circuit diagram illustrating the structure of an inner power supply circuit for the reading circuit according to a third embodiment of the present invention.

In FIG. 4, the resistor value R0 which consists of the series resistor of the resistor R00 and the MOS transistor MPSW is set in the product of the resistance of the resistor R0 and the constant current value which is determined by the MOS transistor MN12AB. That is, as described above, the resistance of the resistor R0 is chosen such that the voltage drop V0 at the resistor R0 becomes about 0.3 V. Also, the bias value of about 0.3 V is ensured between the collector and the emitter of each of the differential bipolar transistors Q21A and Q21B which constitute the cascaded connection, i.e., Vce=about 0.3 V, by the voltage drop V0 caused by the resistor R0, as described above. Even if the resistor R0, the transistor size of the MOS transistor MN12AB, the gate voltage VB1 are supposed to have been designed such that the voltage drop at the resistor R0 become 0.3 V at the room temperature, because the temperature characteristic of each element is different, it is very difficult to keep the voltage drop V0 at the constant value, if the LSI circumstance temperature changes in a range of 0° C. to 150° C., for example. Further, in a case where transistor characteristics such as a threshold voltage, resistor values and so on shifted in the production of an LSI, the voltage drop V0 at the resistor R0 is also shifted from a desired value. As a result, it is difficult to ensure the stable operation of the LSI. FIG. 6 shows the structure of an inner power supply circuit in the read circuit according to the third embodiment of the present invention which can solve this problem.

Referring to FIG. 6, the bias power supply circuit of the third embodiment includes a reference voltage generating section 11, an operation amplifier 12 and a replica sense amplifier section 13. The reference voltage generating section 11 is the circuit which generates the voltage of (Vcc-V0). As an example, there is used a circuit shown in FIG. 6, in which the base-emitter voltage Vbe of a bipolar transistor Q31 which is diode-connected to the high potential power supply Vcc is divided by resistor R31 and R32. Here, V0=Vbe×R31/(R31+R32). The resistances of the resistors R31 and R32 are chosen such that the voltage V0 becomes about 0.3 V. By adequately setting the value of the constant current source I2 which gives the bipolar transistor Q31 a bias, the base-emitter voltage Vbe can take about 0.8 V. More generally, a bandgap reference circuit and so on can be used for the generation of V0, too.

The replica sense amplifier section 13 is a dummy sense amplifier circuit which is a replica of the sense amplifier circuit 6 shown in FIG. 3 which is composed of the resistor R0, R1A and R1B, the differential bipolar transistor pair Q1A and Q1B, and the constant current source MN12AB. However, the bases of the bipolar transistors Q1A and Q1B in the replica sense amplifier section 13 are connected to the high potential power supply line Vcc and the gate of the MOS transistor MN12AB which constitutes the constant current source is connected to the bias power supply voltage VB1. Elements having the same reference numerals as in the first sense amplifier 6 have the same characteristics in the replica sense amplifier section 13. Therefore, the voltage drop at the resistor R0 in the first sense amplifier 6 is the same as the voltage drop V0 at the resistor R0 in the replica sense amplifier section 13 of FIG. 6.

The operation amplifier section 12 is constituted as a current mirror-type differential amplifier which is composed of a differential pair of N-channel MOS transistors MN31 and MN32 whose sauces are connected to in common, P-channel MOS transistors MP31 and MP32 which constitute a current mirror circuit which is connected between the drains of the differential MOS transistor pair and the high potential power supply line Vcc, and a constant current source I1 for the differential MOS transistor pair. Also, a P-channel MOS transistor MP33 and N-channel MOS transistor MN33 constitute an inverter.

In operation, the voltage obtained by subtracting the voltage drop at the resistor R0 (composed of the MOS transistor MPSW and the resistor R00) from the high potential power supply Vcc in the replica sense amplifier section 13 and the reference voltage of (Vcc-V0) which is generated in the reference voltage generating section 10 are supplied to the differential input terminals of the current mirror-type differential amplifier in the operation amplifier section 12 and compared with each other. Note that because the voltage amplitude values which are generated in the resistor R1A and R1B in FIG. 6 are small compared to the voltage drop at the resistor R0, as mentioned above, a node which is connected to the gate of MOS transistor MN32 in the differential amplifier is connected to a connection point between the resistor R1B and the collector of the bipolar transistor Q1B in the replica sense amplifier section 13.

By the comparison result which is generated at a connection point between the drain of the P-channel MOS transistor MP32 and the drain of the N-channel MOS transistor MN32 as an output terminal of the current mirror circuit in the operation amplifier section 12 is supplied to the gate of the P-channel MOS transistor MP33 whose source is connected to the high potential power supply voltage Vcc. The drain of the N-channel MOS transistor MN33 is diode-connected to the gate and the source is connected to the low potential power supply Vee. The connection point between the drain and the gate in the N-channel MOS transistor MN33 is connected to the gate of the constant current source MOS transistor MN12AB which constitutes a part of the replica sense amplifier section 13, to supply the bias power supply voltage VB1.

The reference voltage V0 and the voltage drop at the resistor R0 in the replica sense amplifier section 13 are compared by the operation amplifier having the 2-stage structure as described above, and the feedback loop is formed such that the reference voltage V0 is equal to the voltage drop at the resistor R0. As a result, the bias power supply voltage VB1 for the constant current source MN12AB is generated.

The bias voltage VB1 determined and generated by the inner power supply circuit of FIG. 6 is supplied to the reading circuit of FIG. 3 or 5 as the voltage VB1 (that is, it is supplied as the gate bias voltage for the constant current source MOS transistor).

The circuit performance achieved by the inner power supply circuit according to the third embodiment of the present invention will be described below.

A circuit of sense amplifiers and the peripheral circuits is simulated with a high potential power supply voltage Vcc of a range of 1.0 to 3.3 V using the read circuit and the inner power supply circuit of the present invention. As a result, the collector-emitter voltage of the bipolar transistors equal to or more than 300 mV can be ensured in the entire range of 1.0 to 3.3 V to ensure an operation margin enough to avoid the saturation.

In the above-mentioned conventional reading circuit, the high speed reading operation could be realized only to about 1.8 V. On the other hand, in the present invention, it is ensured that the high speed reading operation can be realized to the power supply voltage of 1.0 V. Further, an increased delay amount is at most 0.1 ns at the power supply voltage of, for example, 3.3 V and high-speed ability is not inferior to the above-mentioned conventional example.

According to the third embodiment, the read circuit using the bipolar transistors can perform the high speed operation even in the power supply voltage Vcc of 1.0 V. This is lower than the lower limit Vccmin of the power supply voltage theoretically estimated from the above equation (2). This is because the collector-emitter voltage Vce which is required for the stable operation of the bipolar transistors Q21A and Q21B of FIG. 3 is ensured by the inner power supply circuit of FIG. 6 even in the power supply voltage Vcc of 1.0 V and the saturation operation problem of the bipolar transistors can be avoided.

Further, as the power supply voltage is decreased, the voltage Vds of the constant current source MN11 of FIG. 3 between the drain and source is also decreased. As a result, the constant current value decreases but the base-emitter forward direction voltage Vf of the bipolar transistors Q21A and Q21B in the first sense amplifier 6 and the bipolar transistors Q31A and Q31B in the current sense section of the second sense amplifier 8 decreases, too. Thus, this can be explained as the above equation (2) take a smaller value.

In addition, if attention is paid only to the inner power supply circuit of the present invention, it is possible to generate the stable bias voltage VB1 until the power supply voltage Vcc becomes to 1.0 V. Also, even if there are caused the change of a threshold value of MOS transistors which composes the whole circuit, and change of resistors in resistance, the influence due to the changes is caused in the power supply circuit and the sense amplifier section in the same manner and can be automatically cancelled by the feeding back structure. Additionally, the stable operation of the circuit can be achieved in the LSI operation environment range of 0° C. to 150° C.

As described above, according to the read circuit for the semiconductor memory such as BiCMOS SRAM of the present invention, by excluding the structure in which the emitter follower outputs of bipolar transistors are supplied to the bases of the differential bipolar transistor pair, which structure dominates the low voltage operation in the conventional read circuit and by using the novel structure, the read circuit which can execute a high speed read operation under the power supply voltage of 1.0 V can be achieved.

Also, according to the present invention, because the feedback-type inner power supply circuit which uses the replica sense amplifier section is used, the operation margin of the read circuit can be ensured without being influenced by changes of power supply voltage, temperature and device precision.

What is claimed is:

1. A semiconductor memory comprising:
a first memory cell array which includes:
a plurality of second memory cell arrays;
a pair of first common data lines;
a first differential amplifier including a first constant current source and a pair of first bipolar transistors whose bases are respectively connected to said first common data lines and whose bases are connected to said first constant current source together; and
a second constant current source of a second differential amplifier,
wherein each of plurality of second memory cell arrays includes:
a plurality of third memory cell arrays;
a pair of second common data lines;
a pair of second bipolar transistors whose bases are respectively connected to said second common data lines, whose emitters are connected to said second constant current source together to constitute said second differential amplifier, and whose collectors are respectively connected to said first common data lines; and
a first control circuit for selectively activating said pair of second bipolar transistors,
wherein each of said plurality of third memory cell arrays includes:
a pair of bit lines;
a plurality of memory cells connected to said pair of bit lines: and
a second control circuit for selectively connecting said pair of bit lines to said pair of second common data lines.

2. A semiconductor memory according to claim 1, wherein each of said first and second constant current sources includes a MOS transistor whose gate is connected to a predetermined voltage.

3. A semiconductor memory according to claim 2, wherein said third control circuit further includes means for selectively deactivating said first constant current source.

4. A semiconductor memory according to claim 1, further comprising:
a sensing section including a pair of third bipolar transistors whose emitters are respectively connected to said third common data lines and third constant current sources;
a fourth differential amplifier for amplifying collector voltages of the third bipolar transistors; and
an output circuit including two output bipolar transistor of an emitter follower structure, for outputting data corresponding to data stored in a selected one of the memory cells from the emitters of the output bipolar transistors.

5. A semiconductor memory according to claim 1, wherein said first differential amplifier includes first and second resistors which are respectively connected to collectors of said first bipolar transistors, and a third resistor which is connected to said first and second resistors at a connection node and a higher potential power supply line, said third resistor being a greater resistance than those of said first and second resistors, and
wherein said semiconductor memory further comprises a bias power supply for supplying the predetermined voltage to the gates of the MOS transistors of said first and second constant current sources.

6. A semiconductor memory according to claim 5, wherein said bias power supply includes:

a reference voltage generating section for generating a reference voltage;
a fifth differential amplifier which is a replica of said first differential amplifier, for generating a voltage corresponding to a voltage at said connection node between said first and second resistors and said third resistor in said first differential amplifier; and
an operation amplifier circuit for generating said predetermined voltage such that the voltage at said connection node is equal to the reference voltage.

7. A method of reading data in a semiconductor memory, comprising the steps of:
selecting a row of memory cells for each of groups of memory cells having a matrix structure such that data of each of the memory cells of the selected row is read out on a bit line pair as a differential signal;
selecting one bit line pair for each of the groups of memory cells to connect the differential signal on the selected bit line pair to a first bipolar transistor pair of a first differential amplifier, wherein the first differential amplifier includes a first constant current source in addition to the first bipolar transistor pair, the first bipolar transistor pair is provided for each of the groups and the first constant current source is commonly provided for all the groups;
selectively activating one of the first bipolar transistor pairs for the groups;
amplifying the differential output of the activated first bipolar transistor pairs by a second differential amplifier;
wherein said second differential amplifier includes a second constant current source, each of the first and second constant current source includes a MOS transistor; and
applying a first predetermined voltage to the gates of the MOS transistors for the first and second constant current source;
wherein said applying step includes applying the first predetermined voltage to the gates of the MOS transistors such that a voltage between collector and emitter is greater a second predetermined voltage in the first and second bipolar transistor pairs;
wherein said second differential amplifier includes resistors connected between bases of the second bipolar transistor pair and a high potential power supply voltage; and
wherein said applying step includes determining the second predetermined voltage from a voltage drop at the resistors and a reference voltage drop from the high potential power supply voltage.

8. A semiconductor memory comprising:
a plurality of first memory cell arrays;
a pair of first common data lines which are provided for said plurality of first memory cell arrays; and
a sensing section including a pair of first bipolar transistors whose emitters are respectively connected to said first common data lines and first constant current sources, and wherein each of said plurality of first memory cell arrays includes:
a plurality of second memory cell arrays;
a pair of second common data lines;
a first differential amplifier including a second constant current source and a pair of second bipolar transistors whose bases are respectively connected to said second common data lines, whose bases are connected to said second constant current source together, and whose collectors are connected to said first common data lines; and a third constant current source of a second differential amplifier, and wherein each of plurality of second memory cell arrays includes:

a plurality of third memory cell arrays;

a pair of third common data lines;

a pair of third bipolar transistors whose bases are respectively connected to said third common data lines, whose emitters are connected to said third constant current source together to constitute said second differential amplifier, and whose collectors are respectively connected to said second common data lines; and a first control circuit for selectively activating said pair of third bipolar transistors, wherein each of said plurality of third memory cell arrays includes:

a pair of bit lines;

a plurality of memory cells connected to said pair of bit lines; and a second control circuit for selectively connecting said pair of bit lines to said pair of second common data lines.

9. A semiconductor memory according to claim 8, wherein each of said first to third constant current sources includes a MOS transistor whose gate is connected to a predetermined voltage.

10. A semiconductor memory according to claim 8, further comprising:

a fourth differential amplifier section for amplifying collector voltages of said first bipolar transistors; and an output circuit including two output bipolar transistor of an emitter follower structure, for outputting data corresponding to data stored in a selected one of the memory cells from the emitters of the output bipolar transistors in accordance with the amplified voltage from said fourth differential amplifier section.

11. A semiconductor memory according to claim 8, wherein said first differential amplifier includes first and second resistors which are respectively connected to collectors of said second bipolar transistors, and a third resistor which is connected to said first and second resistors at a connection node and a higher potential power supply line, said third resistor being a greater resistance than those of said first and second resistors, and wherein said semiconductor memory further comprises a bias power supply for supplying the predetermined voltage to the gates of the MOS transistors of said first to third constant current sources.

12. A semiconductor memory according to claim 11, wherein said bias power supply includes:

a reference voltage generating section for generating a reference voltage;

a fifth differential amplifier which is a replica of said first differential amplifier, for generating a voltage corresponding to a voltage at said connection node between said first and second resistors and said third resistor in said first differential amplifier; and an operation amplifier circuit for generating said predetermined voltage such that the voltage at said connection node is equal to the reference voltage and supplying the said predetermined voltage to said first to third constant current sources.

* * * * *